United States Patent
Bruccoleri et al.

[11] Patent Number: 5,821,829
[45] Date of Patent: Oct. 13, 1998

[54] INTEGRATED CIRCUIT WAITH AUTOMATIC COMPENSATION FOR DEVIATIONS OF THE CAPACITANCES FROM NOMINAL VALUES

[75] Inventors: Melchiorre Bruccoleri, Genoa; Gaetano Cosentino, Catania; Marco Demicheli, Binago; Valerio Pisati, Bosnasco, all of Italy

[73] Assignees: SGS-Thomson Miroelectronics S.r.l., Milan; CO.RI.M.ME. Consorzio Per La Ricerca Sulla Microelettronica Nel Mezzogiorno, Catania, both of Italy

[21] Appl. No.: 810,032

[22] Filed: Mar. 4, 1997

[30] Foreign Application Priority Data

Aug. 3, 1996 [EP] European Pat. Off. ............. 96830103

[51] Int. Cl.⁶ ............................. H03K 3/281; H03L 7/00
[52] U.S. Cl. ..................... 331/113 R; 331/1 R; 331/2; 331/36 C; 331/186
[58] Field of Search ................. 331/113 R, 1 R, 331/40, 186, 36 C, 107 R, 2, 51

[56] References Cited

U.S. PATENT DOCUMENTS

| | | | |
|---|---|---|---|
| Re. 34,317 | 7/1993 | Ikeda | 331/25 |
| 3,857,110 | 12/1974 | Grebene | 331/108 D |
| 4,131,861 | 12/1978 | Malaviya | 331/113 R |
| 4,623,852 | 11/1986 | Abou et al. | 331/113 R |
| 4,904,955 | 2/1990 | Ley | 331/2 |
| 4,980,653 | 12/1990 | Shepherd | 331/16 |
| 5,233,315 | 8/1993 | Verhoeven | 331/113 R |
| 5,369,376 | 11/1994 | Leblebicioglu | 331/17 X |
| 5,459,653 | 10/1995 | Seto et al. | 363/73 |

FOREIGN PATENT DOCUMENTS

| | | |
|---|---|---|
| 0 307 595 A1 | 7/1988 | European Pat. Off. |
| 0 559 039 A2 | 2/1993 | European Pat. Off. |
| 91/11857 | 8/1991 | WIPO |

*Primary Examiner*—Huan Hoang
*Attorney, Agent, or Firm*—Allen, Dyer, Doppelt, Milbrath & Gilchrist, P.A.

[57] ABSTRACT

The system includes various circuit units each having a capacitor and a charging circuit for defining a quantity depending upon the ratio (I/C) between the charging current and the capacitance of the capacitors. In order to compensate automatically for deviations of the actual capacitances from the nominal capacitances due to fluctuations in the parameters of the integrated-circuit manufacturing process, the system has a phase-locked loop which uses one of the circuit units as an adjustable oscillator, and current transducer means which regulates the charging currents of the capacitors of the circuit units in dependence on the regulated charging current of the capacitor of the oscillator, or the error current of the PLL loop.

10 Claims, 3 Drawing Sheets

INTEGRATED CIRCUIT WAITH AUTOMATIC COMPENSATION FOR DEVIATIONS OF THE CAPACITANCES FROM NOMINAL VALUES

FIELD OF THE INVENTION

The present invention relates to integrated circuits and, more particularly, to an integrated circuit including capacitors.

BACKGROUND OF THE INVENTION

It is known that the capacitance of the capacitors in an integrated circuit cannot be determined precisely because of the inevitable fluctuations in the parameters of the manufacturing process. The variations from the nominal or design values are quite large, typically ±20%, so that, when precise capacitances are required, it is necessary to use capacitors outside the integrated circuit or special compensation circuits within or outside the integrated circuit. This presents a serious limitation on the final size of the circuit system of which the integrated circuit forms part.

This problem is noticed particularly in the design of circuit systems in which it is necessary to define quantities, such as time and frequency references, which depend upon the I/C characteristic, that is, the rate at which a current I charges a capacitor of capacitance C. Clearly, in fact, if the capacitance deviates from the design value the I/C characteristic varies correspondingly.

SUMMARY OF THE INVENTION

The object of the present invention is to provide a circuit system of the type indicated above which does not require capacitors outside the integrated circuit and in which the I/C characteristics of various circuit units of the system are automatically kept substantially constant, regardless of the deviation of the actual capacitances from the nominal capacitances.

This object is achieved by the provision of the circuit system a plurality of circuit units integrated in a chip of semiconductor material, wherein each circuit unit contains capacitive means and charging means which supply charging currents to the capacitive means, and each circuit unit defines a quantity (I/C) depending upon a ratio between a charging current of the respective charging means and the capacitance of the respective capacitive means. One circuit unit of the plurality of circuit units preferably includes an adjustable-frequency oscillator generating an oscillator frequency (f), a reference-frequency generator generating a reference frequency (fref), and a frequency comparator connected to the reference-frequency generator and to the oscillator for comparing a frequency correlated to the reference frequency (fref) with a frequency correlated to the frequency (f) of the oscillator and producing an error signal if the frequencies compared are different. The circuit preferably further comprises means for regulating the charging current of the capacitive means of the oscillator in dependence on the error signal so as to keep the frequency (f) of the oscillator at a value precisely correlated to the reference frequency (fref), and current transducer means responsive to the charging current of the capacitive means of the oscillator for regulating the charging current of the capacitive means of at least one of the other circuit units in dependence on the regulated charging current of the capacitive means of the oscillator.

BRIEF DESCRIPTION OF THE DRAWINGS

The invention will be understood better from the following detailed description of two embodiments given with reference to the appended drawings, in which.

DETAILED DESCRIPTION OF PREFERRED EMBODIMENTS

Figure 1:
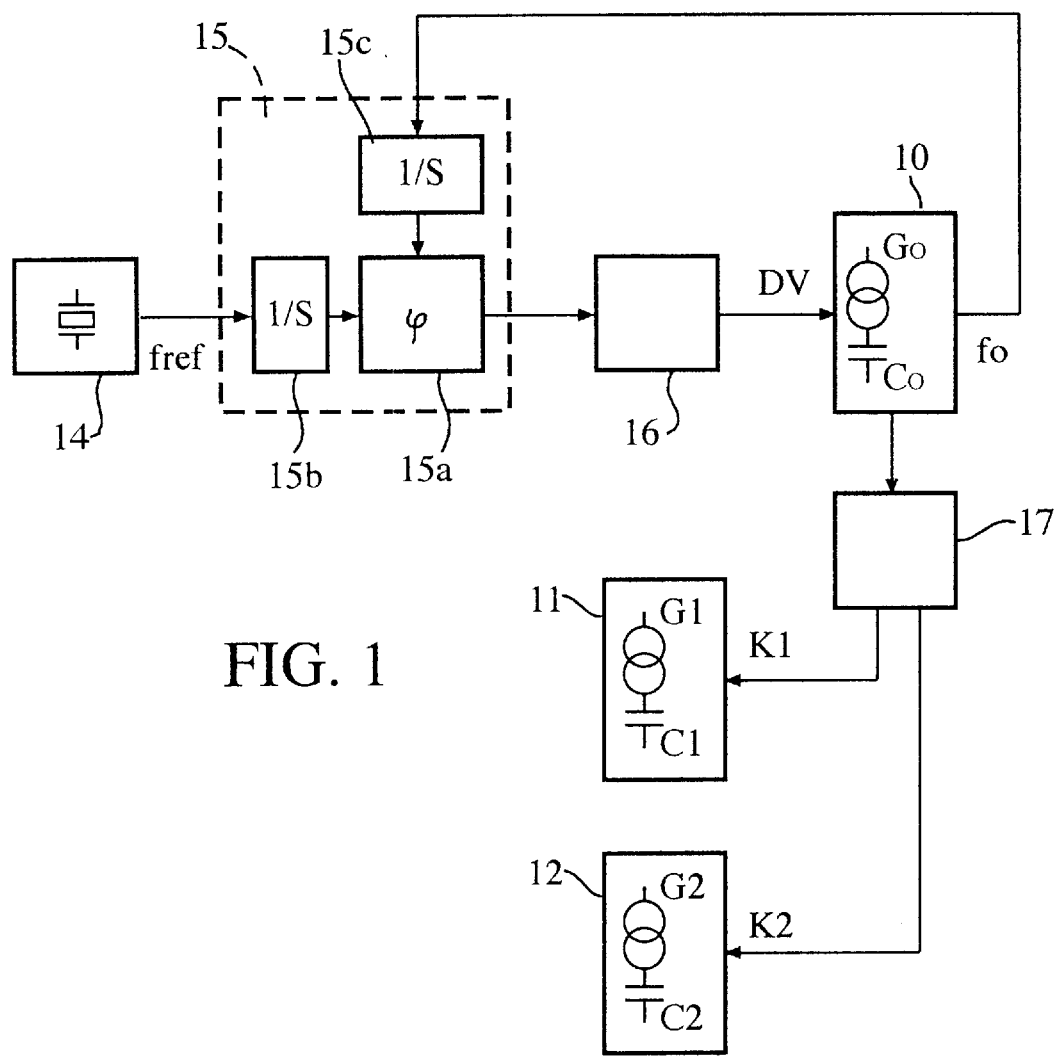
FIG. 1 is a block diagram of a circuit system according to a schematic embodiment of the invention.

In the diagram of FIG. 1, the blocks indicated 10, 11 and 12 represent three circuit units of a circuit system integrated in a chip of semiconductor material. Each unit contains a respective capacitor C0, C1, C2 and charging means, for example, a resistor or a current mirror, represented by the symbol of a current generator G0, G1, G2, connected so as to supply a charging current to the capacitor. Although there are three of these circuit units in this embodiment, it is intended that there may be only two or more than three.

In each of the circuits 10, 11 and 12, a quantity is defined which depends upon the I/C ratio between the charging current and the capacitance of the capacitor. The I/C ratio of each circuit is determined at the design stage by suitable dimensions of the capacitor and of the charging means associated therewith.

Figure 2:
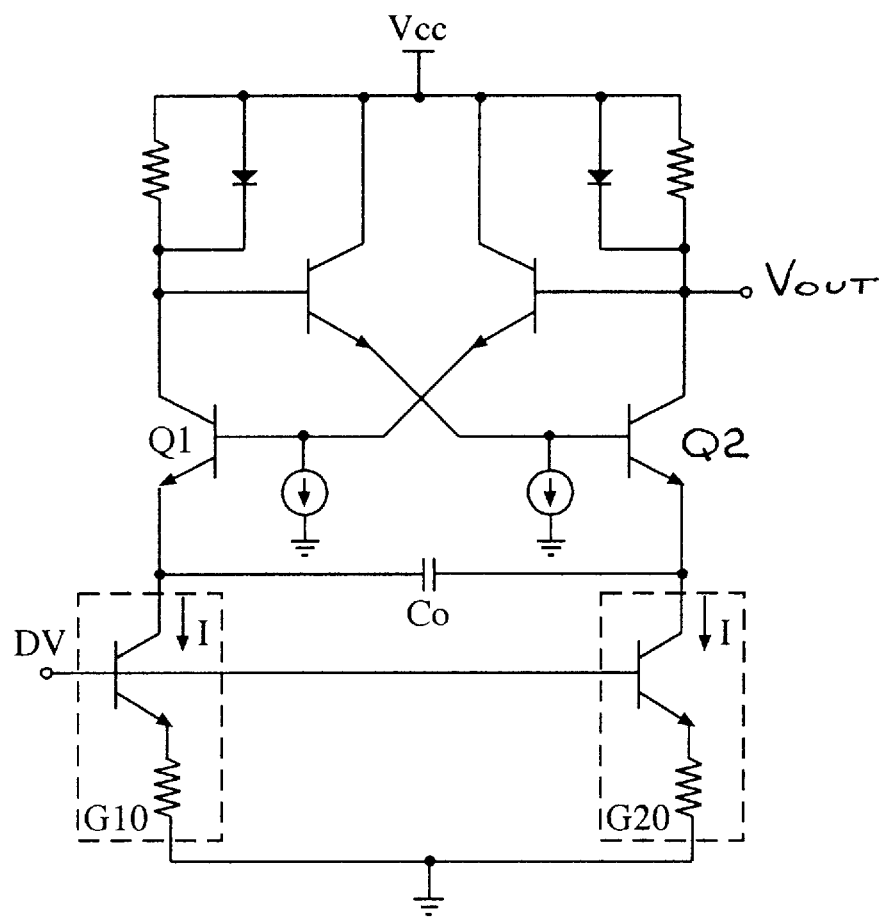
FIG. 2 is the circuit diagram of a conventional oscillator as in the prior art that may be used in the present invention.

To compensate for the unpredictable deviations of the capacitance of the capacitors from the nominal values, according to the invention, one of the circuits, that indicated 10 in the drawing, is an adjustable-frequency oscillator which forms part of a phase-locked loop (PLL). The circuit 10 may be an astable circuit the switching frequency of which can be controlled by variation of the voltage at its control terminal. An oscillator of this type is described, for example, on pages 695–698 of the volume entitled "Analog integrated circuits" by P. R. Gray and R. G. Meyer, Editor Wiley, Edition III, 1993 and shown in FIG. 2 of the appended drawings.

The switching frequency of the two transistors Q1 and Q2 is $$fo = I/4\, C0 \cdot V_{BE(on)}$$

where I is the current of the generators G10 and G20, C0 is the capacitance of the capacitor indicated by the same reference symbol and $V_{BE(on)}$ is the voltage drop at a forward biased p-n junction. To prevent the frequency fo from varying with temperature, the circuit can be modified, in a known manner, to ensure that the frequency fo no longer depends on $V_{BE(on)}$ which, as is known, depends on the temperature. Instead, the frequency fo may depend on a reference voltage independent of the temperature such as, for example, the voltage produced by a band-gap referenced biasing circuit such as, for example, that described on pages 338 to 346 of the volume mentioned above. The frequency will thus be:

$$fo = I/C0 \cdot K \cdot Vbg$$

where K is a constant and Vbg is the band-gap voltage.

The PLL loop comprises, in addition to the oscillator 10, a reference-frequency generator 14, a frequency comparator 15, comprising a phase detector 15a and two frequency-phase convertors 15b, 15c, and a low-pass filter 16. The output signal of frequency fo of the oscillator 10 is compared in phase in the phase detector 15a with the output of frequency fref of the reference oscillator 14. The signal output by the phase detector 15a has a direct-current component the amplitude of which depends upon the difference in the frequencies of the two input signals. This component is obtained at the output of the filter 16 and is applied as an error voltage DV to the control terminal of the oscillator 10. As a result of the adjustment, the frequency fo of the oscillator is made equal to the reference frequency fref. Since the reference oscillator 14 can be formed so as to produce a strictly constant frequency with the use, for example, of a quartz oscillator outside the integrated circuit, the PLL loop ensures an equally constant frequency fo of the output signal of the oscillator 10.

It is important to point out at this point that any deviation of the capacitance C0 from the nominal value is automatically compensated by a corresponding variation of the current I of the oscillator 10 from the value which it would have had with the nominal capacitance.

According to this embodiment of the invention, the oscillator current I is used to determine the charging current in the circuit means 11 and 12. In practice, a current transducer 17 detects the oscillator current and produces correction signals, indicated k1 and k2 which influence the charging means, that is, the current generators G1 and G2 of the circuit units 11 and 12. The transducer 17, in combination with the charging means, can be formed by a current mirror.

Since the deviation of the capacitances of the circuit units 11 and 12 from the nominal values is proportional to that of the capacitance of the oscillator 10 because the capacitors were made at the same time by the same process, the variations of the respective charging currents are also proportional to the variation of the oscillator current I. The I/C characteristics of the circuits 11 and 12 are therefore equal to the design characteristics, regardless of process variations.

The embodiment of the invention described above can advantageously be used in circuit systems in which the I/C characteristics of the circuit units, such as the units 11 and 12, have to remain unchanged in all operating conditions of the system. A similar embodiment may be used when all of the I/C characteristics have to vary in the same manner, for example, in dependence on a frequency which is common to the entire system and which may assume different values. The circuit system of FIG. 1, in this case, is modified in order to have a variable-frequency oscillator or a constant-frequency oscillator followed by a programmable frequency divider, instead of the fixed-frequency reference oscillator fref.

Figure 3:
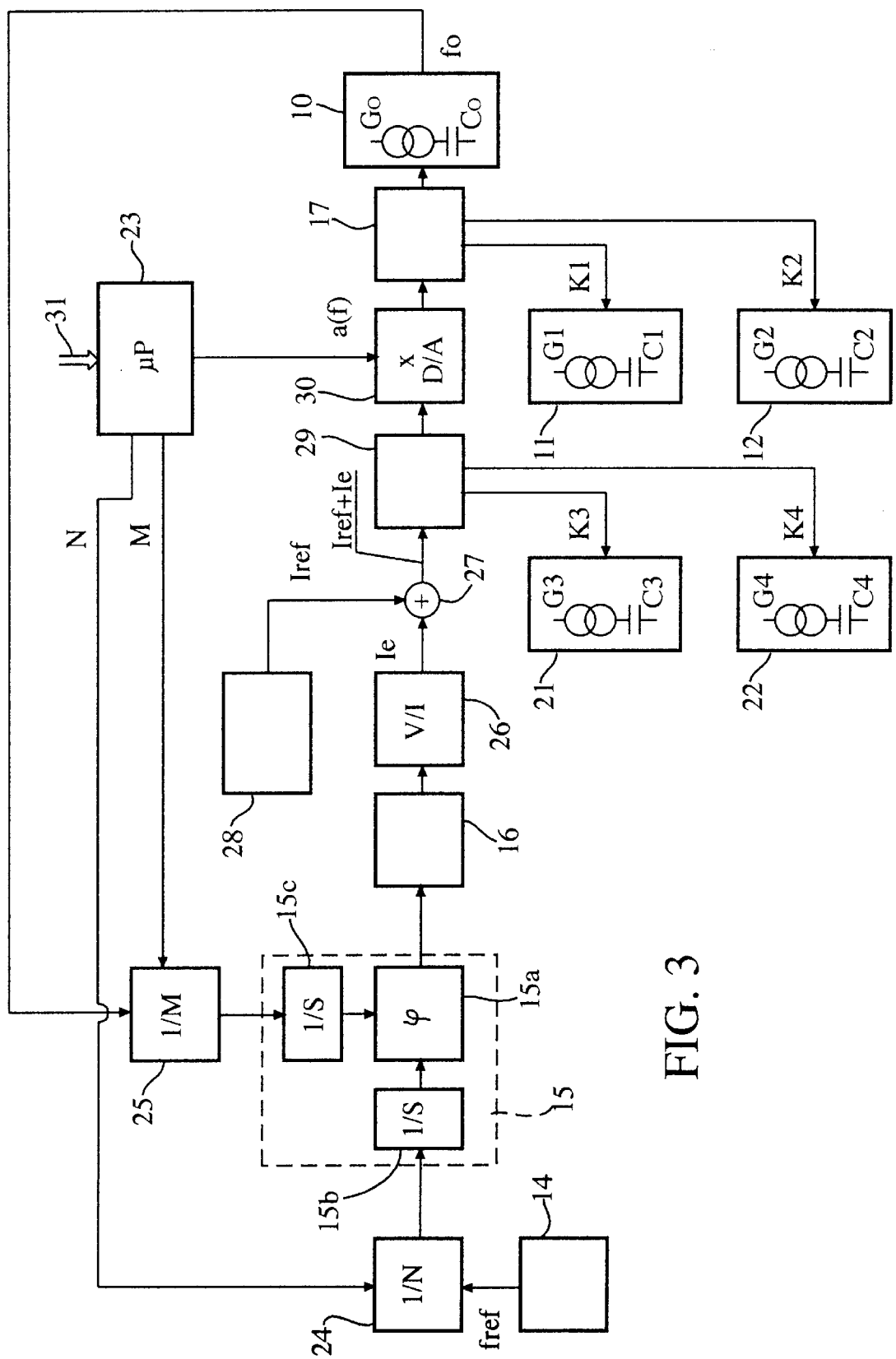
FIG. 3 is a block diagram of a circuit system according to a preferred embodiment of the invention.

In the case of a circuit system in which there are both circuit units with I/C characteristics all of which are variable in the same manner with the system frequency, and circuit units with constant I/C characteristics, that is, which are not dependent on the system frequency, it is possible to use the embodiment of the invention shown in FIG. 3. In this embodiment, components identical or corresponding to those of FIG. 1 are indicated by the same reference numbers or symbols.

The circuit system of FIG. 3 comprises a plurality of circuit units each comprising a capacitor and means for charging the capacitor. All of the capacitors are formed in the same integrated circuit. More particularly, the system comprises two units, indicated 11 and 12, the I/C characteristics of all of which are intended to vary in the same manner in dependence on a system frequency f which may assume different selectable values. The system further comprises two units, indicated 21 and 22, the I/C characteristics of which have to remain constant for any value of the system frequency. In this embodiment also, one of the units with I/C characteristics is an oscillator, again indicated 10, for example, of the type described with reference to FIG. 1, but controlled by current instead of voltage, in a phase-locked loop (PLL). The current control takes place by direct action, for example, by a current mirror, on the generators G10 and G20 of the two branches of the astable circuit which constitutes the oscillator. The regulation current is therefore proportional to the oscillator current I.

The PLL loop also comprises a frequency comparator 15 with a phase detector 15a and frequency-phase converters 15b and 15c, a reference oscillator 14, a low-pass filter 16, as well as a first programmable frequency divider 24 interposed between the reference oscillator 14 and an input of the frequency comparator 15. The PLL loop further includes a second programmable frequency divider 25 interposed between the output of the controllable oscillator 10 and another input of the frequency comparator 15, a voltage-to-current converter 26 connected to the output of the filter 16, a current adder node 27 connected to the output of the converter 26 and to a reference-current generator 28, as well as a first current transducer 29, a current multiplier 30 and a second current transducer 17, connected in cascade between the output of the adder node 27 and the control input of the oscillator 10.

Two terminals of the first current transducer 29 are connected to respective units 21 and 22 with I/C characteristics and two terminals of the second current transducer 17 are connected to respective units 11 and 12 with I/C characteristics. Advantageously, the first current transducer 29 may be a current mirror through the input branch of which the output current of the adder 27 flows and which has two output branches which produce currents proportional, with coefficients k3 and k4, to that of the input branch, for charging the capacitances C3 and C4 of the circuit units 21 and 22. Similarly, the second current transducer 17 may be a current mirror through the input branch of which the output current of the multiplier 30, which is also the current of the generators G10 and G20 of the oscillator 10, flows and which has two output branches which produce currents proportional, with coefficients k1 and k2, to the current of the input branch, for charging the capacitances C1 and C2 of the circuit units 11 and 12.

A frequency selection unit 23 has a first output connected to an input of the current multiplier 30, a second output connected to the frequency divider 24 and a third output connected to the frequency divider 25. The reference oscillator 14 is preferably a quartz oscillator outside the integrated circuit. The reference-current generator 28 is advantageously formed as a band-gap referenced biasing circuit having a precision resistor in series outside the integrated circuit. The reference current output by the generator 28 is $$Iref=Vbg/Rext$$

where Vbg is the band-gap voltage and Rext is the resistance of the external precision resistor.

The frequency selection unit 23 may be a microprocessor which can produce digital output quantities in response to suitable commands, generally indicated by an arrow 31. One quantity, indicated a(f), represents a multiplication factor depending upon the frequency selected and is applied to the multiplier 30 and each of another two quantities, indicated N and M, represents a division coefficient for the dividers 24 and 25, respectively, to which they are applied.

The current multiplier 30 may advantageously be formed as a digital/analog converter of known type formed substantially as a current mirror having an input branch through which the current coming from the transducer 29 flows and a plurality of output branches each of which can conduct a current correlated in a weighted manner to the current of the input branch. Each of the output branches is opened or closed according to the value of a digit of the digital input quantity. The output current of the converter is given by the sum of the currents of the output branches of the mirror and is, therefore, equal to the product of the current of the input branch and the multiplication coefficient defined by the digital input quantity a(f).

The operation of the circuit system of FIG. 3 will now be considered. The reference current Iref is selected in a manner such that, for a given coefficient a(fo) corresponding to a given frequency fo, the product a(fo)·Iref is equal to the current Io necessary for the oscillator having a capacitance C0 equal to the nominal capacitance, to oscillate at the given frequency fo. In these conditions, in operation, the input signals of the frequency comparator 15 have the same frequency, that is, fo/M=fref/N and a current equal to Iref passes through the output of the adder node 27, that is, no error current Ie is added thereto in the node 27. Thus Ie=0 and $$fo = Io/C0 \cdot K \cdot Vbg$$

which if Io=a(fo)·Iref, becomes:

$$fo = a(fo) \cdot Iref/C0 \cdot K \cdot Vbg \quad (1)$$

Substitution of Iref=Vbg/Rext in (1) gives $$fo = a(fo)/C0 \cdot K \cdot Rext$$

If the capacitance of the oscillator is not the nominal capacitance but deviates therefrom by DC, $$fo' = I'(C0+DC) \cdot K \cdot Vbg$$

and the PLL loop will give rise to an error current Ie which is added to the reference current Iref in the adder 27.

Substitution of I'=a(fo)·(Iref+Ie) gives $$fo' = a(fo) \cdot (Iref+Ie)/(C0+DC) \cdot K \cdot Vbg \quad (2)$$

As a result of the adjustment of the PLL loop, fo is equal to fo' so that putting (1) equal to (2) gives $$a(fo) \cdot Iref/C0 \cdot K \cdot Vbg = a(fo)(Iref+Ie)/(C0+DC) \cdot K \cdot Vbg$$

which, by simplification, becomes $$Iref/C0 = (Iref+Ie)/(C0+DC)$$

This equation expressed in words means that if the capacitance of the oscillator is not the nominal capacitance, a variation of the current automatically compensates for the deviation. This automatic compensation of the capacitance of the oscillator is used to compensate automatically for similar deviations of the capacitances of the circuit units 11, 12, 21, and 22.

In fact, because of the current mirror transducer 17, the currents in the circuit units 11 and 12 are proportional, with the coefficients k1 and k2, to the current a(f)·I of the oscillator 10. Since the percentage deviation of the capacitances from the nominal values is equal to that of the capacitance of the oscillator, it is compensated by a corresponding variation of the current, just as occurs in the oscillator. Naturally, the I/C characteristic for the units 11 and 12 also varies with the frequency selected in the selection unit 23 at the time in question.

As far as the circuit units 21 and 22 are concerned, their currents are obtained, by means of the current mirror transducer 29, from the current output by the adder node 27 which, as already pointed out, is the sum of the current Iref of the reference generator 28 and of the current Ie (positive or negative) due to the deviation of the capacitance of the oscillator 10 from the nominal capacitance. Since this current is independent of the frequency selected, the I/C characteristics of the circuit units 21 and 22 are also independent of the frequency. They will also remain unchanged in the event of deviations of their capacitances from the nominal capacitances since the respective currents will vary correspondingly and automatically.

The circuit system described above with reference to FIG. 3 has advantageously been used in a control system of a reading/writing unit for magnetic data-carrier discs. This control system required frequencies selectable in dependence on the position of the reading/writing head on the disc and, hence, circuits operating in synchronism with the system frequency, but also circuits with time constants which are independent of the frequency. By permitting automatic compensation for the deviations of all of the capacitances of the integrated circuit from the respective nominal values, the use of the system according to the invention involved advantages in terms of both size and circuit simplicity, since it did not require external capacitors or calibration circuits.

In this application, the controllable-frequency oscillator and the phase-locked loop PLL not only provided automatic compensation means for the capacitances of the circuit units with I/C characteristics, but were also integrated parts of the circuit system as a whole for generating operating frequencies. The invention may, however, also be used to advantage in systems in which the oscillator and the respective PLL loop do not have a specific function in the system but serve solely for compensating automatically for deviations in the capacitances of some circuits from the nominal capacitances.

We claim:

1. A circuit system comprising:
   a plurality of circuit units integrated in a chip of semiconductor material, each circuit unit containing capacitive means and charging means which supply charging currents to the capacitive means, each circuit unit defining a quantity (I/C) depending upon a ratio between a charging current of the respective charging means and the capacitance of the respective capacitive means;
   one circuit unit of the plurality of circuit units comprising
      an adjustable-frequency oscillator generating an oscillator frequency (f),
      a reference-frequency generator generating a reference frequency (fref),
      a frequency comparator connected to the reference-frequency generator and to the oscillator for comparing a frequency correlated to the reference frequency (fref) with a frequency correlated to the frequency (f) of the oscillator and producing an error signal if the frequencies compared are different, means for regulating the charging current of the capacitive means of the oscillator in dependence on the error signal so as to keep the frequency (f) of the oscillator at a value precisely correlated to the reference frequency (fref), and current transducer means responsive to the charging current of the capacitive means of the oscillator for regulating the charging current of the capacitive means of at least one of the other circuit units in dependence on the regulated charging current of the capacitive means of the oscillator, and wherein the means for regulating the charging current of the capacitive means of the oscillator comprises a reference current generator of a reference current output (Iref) and an adder for adding the reference current output (Iref) to the error signal and for supplying the output resulting from the sum to the charging means of the oscillator to regulate the charging current of the capacitive means of the oscillator.

2. A circuit system according to claim 1, wherein the reference current output (Iref) is selected in a manner such that, for a predetermined capacitance of the capacitive means of the oscillator, the charging of the capacitive means of the oscillator is brought about substantially solely by the reference current output (Iref); and wherein the current transducer means comprises a first transducer connected to the adder to obtain the current for regulating the charging current of the capacitive means of at least one of the other circuit units directly from the quantity resulting from the sum.

3. A circuit system according to claim 2, wherein the means for regulating the current for charging the capacitive means of the oscillator comprises a multiplier inserted between the adding and the charging means of the oscillator and which has a multiplication factor which can be predetermined in dependence on the frequency (f) of the oscillator to output a quantity proportional to the multiplication factor; and wherein the current transducer means comprises a second transducer connected to the multiplier to obtain the current for regulating the charging current of the capacitive means of at least one of the other circuit units from the quantity output by the multiplier.

4. A circuit system according to claim 3, further comprising:

a first programmable frequency divider inserted between the reference-frequency generator and the frequency comparator to supply a signal having the frequency correlated to the reference frequency (fref); and a second programmable frequency divider inserted between the output of the oscillator and the frequency comparator to supply a signal having the frequency correlated to the oscillator frequency (f), and in which the means for regulating the charging current of the capacitive means of the oscillator comprises a frequency selection unit connected to the multiplier and to the first and second programmable frequency dividers for determining the multiplication factor of the multiplier and the division coefficients of the first and second programmable frequency dividers.

5. A circuit system according to claim 4, wherein the multiplier comprises a digital/analog converter and the frequency-selection unit comprises a microprocessor; and wherein the multiplication factor and the division coefficients are digital quantities produced by the microprocessor.

6. A control system for a reading/writing unit for a magnetic data-carrier disc comprising:

a plurality of circuit units integrated in a chip of semiconductor material, each circuit unit containing capacitive means and charging means which supply charging currents to the capacitive means, each circuit unit defining a quantity (I/C) depending upon a ratio between a charging current of the respective charging means and the capacitance of the respective capacitive means;

one circuit unit of the plurality of circuit units comprising:

an adjustable-frequency oscillator generating an oscillator frequency (f), a reference-frequency generator generating a reference frequency (fref), a frequency comparator connected to the reference-frequency generator and to the oscillator for comparing a frequency correlated to the reference frequency (fref) with a frequency correlated to the frequency (f) of the oscillator and producing an error signal if the frequencies compared are different, means for regulating the charging current of the capacitive means of the oscillator in dependence on the error signal so as to keep the frequency (f) of the oscillator at a value precisely correlated to the reference frequency (fref), and current transducer means responsive to the charging current of the capacitive means of the oscillator for regulating the charging current of the capacitive means of at least one of the other circuit units in dependence on the regulated charging current of the capacitive means of the oscillator, and wherein the means for regulating the charging current of the capacitive means of the oscillator comprises a reference current generator of a reference current output (Iref) and an adder for adding the reference current output (Iref) to the error signal and for supplying the quantity resulting from the sum to the charging means of the oscillator to regulate the charging current of the capacitive means of the oscillator.

7. A control system according to claim 6, wherein the reference current output (Iref) is selected in a manner such that, for a predetermined capacitance of the capacitive means of the oscillator, the charging of the capacitive means of the oscillator is brought about substantially solely by the reference current output (Iref); and wherein the current transducer means comprises a first transducer connected to the adder to obtain the current for regulating the charging current of the capacitive means of at least one of the other circuit units directly from the quantity resulting from the sum.

8. A control system according to claim 7, wherein the means for regulating the current for charging the capacitive means of the oscillator comprises a multiplier inserted between the adding and the charging means of the oscillator and which has a multiplication factor which can be predetermined in dependence on the frequency (f) of the oscillator to output a quantity proportional to the multiplication factor; and wherein the current transducer means comprises a second transducer connected to the multiplier to obtain the current for regulating the charging current of the capacitive means of at least one of the other circuit units from the quantity output by the multiplier.

9. A control system according to claim 8, further comprising:

a first programmable frequency divider inserted between the reference-frequency generator and the frequency comparator to supply a signal having the frequency correlated to the reference frequency (fref); and a second programmable frequency divider inserted between the output of the oscillator and the frequency comparator to supply a signal having the frequency correlated to the oscillator frequency (f), and in which the means for regulating the charging current of the capacitive means of the oscillator comprises a frequency selection unit connected to the multiplier and to the first and second programmable frequency dividers for determining the multiplication factor of the multiplier and the division coefficients of the first and second programmable frequency dividers.

10. A control system according to claim 9, wherein the multiplier comprises a digital/analog converter and the frequency-selection unit comprises a microprocessor; and wherein the multiplication factor and the division coefficients are digital quantities produced by the microprocessor.

* * * * *

UNITED STATES PATENT AND TRADEMARK OFFICE
CERTIFICATE OF CORRECTION

PATENT NO.  : 5,821,829
DATED       : October 13, 1998
INVENTOR(S) : Bruccoleri et al It is certified that error appears in the above-identified patent and that said Letters Patent is hereby corrected as shown below:

On the title page, item:

[54] Title

Strike:
"INTEGRATED CIRCUIT WAITH AUTOMATIC COMPENSATION FOR DEVIATIONS OF THE CAPACITANCES FROM NOMINAL VALUES"

Insert:
"INTEGRATED CIRCUIT WITH AUTOMATIC COMPENSATION FOR DEVIATIONS OF THE CAPACITANCES FROM NOMINAL VALUES"

[75] Inventors

Strike:
Melchiorre Bruccoleri, Genoa; Gaetano Cosentino, Catania; Marco Demicheli, Binago; Valerio Pisati, Bosnasco, all of Italy Insert:
Melchiorre Bruccoleri, Genova; Gaetano Cosentino, Catania; Marco Demicheli, Binago; Valerio Pisati, Bosnasco, all of Italy

UNITED STATES PATENT AND TRADEMARK OFFICE
CERTIFICATE OF CORRECTION

PATENT NO. : 5,821,829
DATED : October 13, 1998
INVENTOR(S) : Bruccoleri et al.

It is certified that error appears in the above-identified patent and that said Letters Patent is hereby corrected as shown below:

On the title page: Item

[73] Assignees

Strike:
SGS-Thomson Miroelectronics S.r.l., Milan; CO.RI.M.ME. Consorzio Per La Ricerca Sulla Microelettronica Nel Mezzogiorno, Catania, both of Italy Insert:
SGS-Thomson Microelectronics S.r.l., Agrate Brianza; CO.RI.M.ME. Consorzio Per La Ricerca Sulla Microelettronica Nel Mezzogiorno, Catania, both of Italy Column 1, line 1

Strike:
"INTEGRATED CIRCUIT WAITH"

Insert:
"INTEGRATED CIRCUIT WITH"

Signed and Sealed this

Thirtieth Day of March, 1999

Attest:

Q. TODD DICKINSON

Attesting Officer

Acting Commissioner of Patents and Trademarks